United States Patent
Sikka et al.

(10) Patent No.: US 8,451,035 B2
(45) Date of Patent: May 28, 2013

(54) SYNTHESIZABLE DLL ON SYSTEM-ON-CHIP

(75) Inventors: Prateek Sikka, New Delhi (IN); Rajesh Chopra, Greater Noida (IN); Manoj Yadav, Greater Noida (IN)

(73) Assignee: STMicroelectronics International NV, Amsterdam (NL)

( * ) Notice: Subject to any disclaimer, the term of this patent is extended or adjusted under 35 U.S.C. 154(b) by 222 days.

(21) Appl. No.: 12/969,220

(22) Filed: Dec. 15, 2010

(65) Prior Publication Data

US 2011/0140748 A1 Jun. 16, 2011

(30) Foreign Application Priority Data

Dec. 15, 2009 (IN) ............................ 2610/DEL/2009

(51) Int. Cl.
*H03L 7/06* (2006.01)
(52) U.S. Cl.
USPC .......................................... 327/158; 327/147

(58) Field of Classification Search
USPC .................................................. 327/149, 158
See application file for complete search history.

(56) References Cited

U.S. PATENT DOCUMENTS

| | | | | |
|---|---|---|---|---|
| 6,999,547 B2* | 2/2006 | Braceras et al. | ............... | 375/371 |
| 2004/0183518 A1* | 9/2004 | Weller et al. | ............... | 324/76.58 |
| 2010/0213992 A1* | 8/2010 | Hyun et al. | .................... | 327/147 |
| 2011/0140748 A1* | 6/2011 | Sikka et al. | .................... | 327/158 |

* cited by examiner

*Primary Examiner* — Adam Houston
(74) *Attorney, Agent, or Firm* — Seed IP Law Group PLLC

(57) ABSTRACT

The present disclosure provides an emulator mapping process on a system-on-a-chip (SoC) for debugging. The implementation reduces manual intervention and makes the emulation mapping process very generic and technology independent and hence it reduces overall project cycle time. In the present disclosure, the SoCs containing analog delay locked loops are made suitable for emulation by configuring analog delay locked loop module in parallel with a synthesizable delay logic module. Further, selection logic is provided to select any one of the module at a time.

20 Claims, 3 Drawing Sheets

SYNTHESIZABLE DLL ON SYSTEM-ON-CHIP

BACKGROUND

1. Technical Field

The present disclosure relates to emulation of system-on-a-chip (SoC) devices for debugging, and, more specifically, to provide emulation capability for SoCs.

2. Description of the Related Art

A System-On-Chip (SoC) with embedded cores, such as DSP (Digital signal processing) core or ARM (Advanced RISC Machine) core, typically has the capability for emulation. Emulation is a process used in debugging hardware/software interactions or interfaces, as well as debugging software failures. The standard hardware used for this purpose is called emulators. A software tool chain (available from emulator vendor) analyzes the HDL (Hardware Description Language) design, synthesizes and optimizes the design. The emulation database thus created is used by a user to emulate his design and verify its functionality at a much faster pace than the conventional PC (personal computer) based simulators. The emulation hardware engines may have different architectures. Typically they may be FPGA (Field Programmable Gate array), LUT (Look-Up-Table) or high performance CPU (Central Processing Unit) array based structures.

At present, the role of emulation is growing rapidly in the integrated circuit design. Simulation of close to real chip scenarios and timely fixing of design bugs in the design cycle further drives the need for availability of an emulation platform at a very early stage in the design cycle. The mapping of a design on an emulator has many advantages. One advantage is design speedup. Yet, there are several issues while mapping the process of a mixed signal design on an SoC, especially with the analog components such as PLLs (Phase Locked Loops), DLLs (Delay Locked Loops), audio/video DACs (Digital-to-Analog Converters)/ADCs (Analog-to-Digital Converters). The analog components present on the SoC are not synthesizable in the normal emulation flow.

Considering memory architectures such as those that follow a DDR SDRAM (Double-Data-Rate Synchronous Dynamic Random Access Memory) standard, reading a DDR SDRAM memory requires a finite delay on several signals such as clock, data strobes etc. The delay is provided on these signals by the DDR controller and pad logic architecture present on the chip. However, in case of SoCs, delay is inserted by an on chip delay element such as a DLL (Delay locked loop). The DLLs used for such analog applications are not synthesizable for emulation platforms.

Delays inserted by behavioral statements in HDL (Verilog/VHDL) for such analog components are also ignored by emulation synthesis tools. Synthesis tools for emulators may optimize multiple driven or undriven nets. Hence, care is taken while coding HDL as this may lead to deviation from expected behavior. Another possible technique may be the delay is inserted manually in the desired signal path for emulation. But this technique again is not suitable and decreases the efficiency of the emulation platforms.

In certain cases, a digital DLL is used. The digital DLL works on a digital locking technique and replaces analog DLLs but again, the emulation process is affected by other non-synthesizable components like digital phase detectors, etc. These implementations also require additional jitter control circuitries, which have no meaning for emulation systems.

BRIEF SUMMARY

An apparatus may be summarized as including an analog delay locked loop module having an input and an output; a synthesizable delay logic module having an input and an output, the synthesizable delay logic module input coupled to the analog delay locked loop module input; and a selection logic having at least two inputs and an output, a first input of the selection logic operatively coupled to the analog delay locked loop module output and a second input of the selection logic coupled to the synthesizable delay logic module output, the selection logic configured to pass one of the at least two inputs to the selection logic output.

The selection logic may be a multiplexer. The synthesizable delay logic may include a plurality of delay gates coupled in series; and a multiplexer coupled to the output of each delay gate. The multiplexer may have a selection line bus signal coupled to a programmed signal. The analog delay locked loop module and the synthesizable delay logic module may be electrically configured in parallel. The analog delay locked loop module, the synthesizable delay logic module, and the selection logic may be circuits in a system-on-a-chip. The analog delay locked loop module, the synthesizable delay logic module, and the selection logic may be circuits in a system-on-chip, a memory controller, e.g., DDR SDRAM memory control circuit, or some other circuit.

A method of emulation in a system-on-a-chip may be summarized as including disabling operation of an analog delay locked loop module; enabling operation of a synthesizable delay logic module; delaying a signal that is input into the synthesizable delay logic module; providing a first selection signal to a first selection logic to direct the enabling and disabling; and providing a second selection signal to a second selection logic to direct the delaying.

Providing the first selection signal may include coupling a signal to a multiplexer, the multiplexer configured to pass either a signal from the analog delay locked loop module or a signal from the synthesizable delay logic module. The delaying may include passing the signal to an input of a first delay gate of a series of delay gates; passing the signal through the remaining delay gates of the series of delay gates, the input of each remaining delay gate of the series coupled to the output of a previous delay gate of the series; and selecting the output of one delay gate of the series as the output of the synthesizable delay logic module. Providing the second selection signal may include coupling an n-bit signal to a multiplexer, the multiplexer configured to implement the selecting of the output of one delay gate of the series as the output of the synthesizable delay logic module. Coupling the n-bit signal may include coupling a signal of at least 5 bits.

The method of emulation in a system-on-a-chip may further include enabling operation of the analog delay locked loop module in a normal mode; and disabling operation of the synthesizable delay logic module after operation in an emulation mode. The method of emulation in a system-on-a-chip may further include providing a clock input to the synthesizable delay logic module; and delaying the signal that is input to the synthesizable delay logic module by a selectable number of clock cycles, the selectable number of clock cycles determined by the second selection signal. The disabling, enabling, providing the first selection signal, and providing the second selection signal may all occur without powering down the system-on-a chip. Delaying the signal may include delaying a data strobe signal.

Another embodiment of the invention may be summarized as a computer readable device storing instructions that are executable by a processor to cause an electronic device to disable operation of an analog delay locked loop module; enable operation of a synthesizable delay logic module; delay a signal that is input into the synthesizable delay logic module; provide a first selection signal to a first selection logic to direct the enabling and disabling; and provide a second selection signal to a second selection logic to direct the delaying.

The instructions executable by said processor may further cause the electronic device to pass the signal to an input of a first delay gate of a series of delay gates; pass the signal through the remaining delay gates of the series of delay gates, the input of each remaining delay gate of the series coupled to the output of a previous delay gate of the series; and select the output of one delay gate of the series as the output of the synthesizable delay logic module. The instructions executable by said processor may further cause the electronic device to enable operation of the analog delay locked loop module in a normal mode; and disable operation of the synthesizable delay logic module after operation in an emulation mode. The instructions executable by said processor may further cause the electronic device to provide a clock input to the synthesizable delay logic module; and delay the signal that is input to the synthesizable delay logic module by a selectable number of clock cycles, the selectable number of clock cycles determined by the second selection signal.

BRIEF DESCRIPTION OF THE SEVERAL
VIEWS OF THE DRAWINGS

The present disclosure explains the various embodiments of the instant disclosure in the following description, taken in conjunction with the accompanying drawings, wherein.

Figure 1:
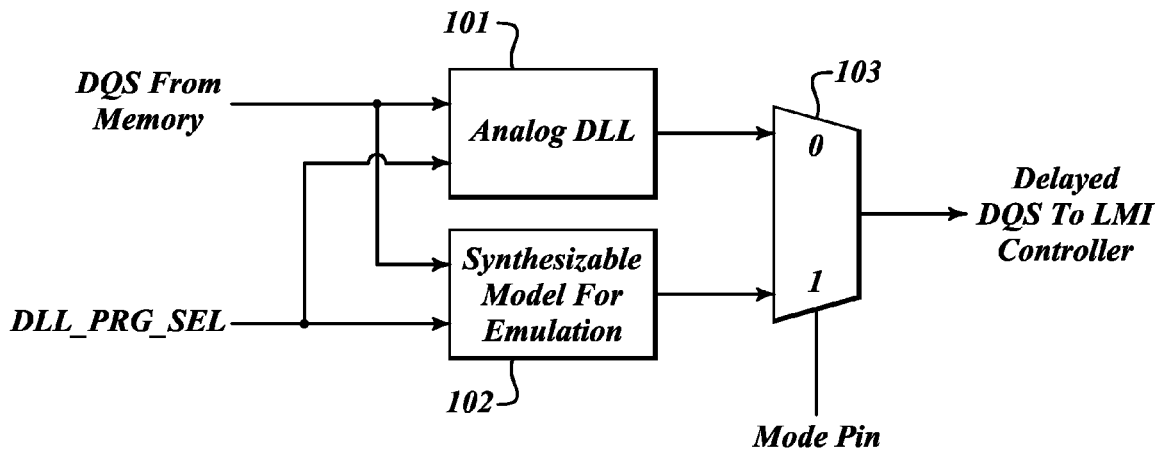
FIG. 1 illustrates a system-on-a-chip which discloses an integration of analog delay logic and synthesizable delay logic according to an embodiment of the present disclosure.

While the disclosure will be described in conjunction with the illustrated embodiment, it will be understood that it is not intended to limit the disclosure to such embodiment. On the contrary, it is intended to cover all alternatives, modifications and equivalents as may be included within the spirit and scope of the disclosure as defined by the appended claims.

DETAILED DESCRIPTION

The embodiments of the present disclosure will now be described in detail with reference to the accompanying drawings. However, the present disclosure is not limited to the embodiments. The present disclosure can be modified in various forms. Thus, the embodiments of the present disclosure are only provided to explain more clearly the present disclosure to the ordinarily skilled in the art of the present disclosure. In the accompanying drawings, like reference numerals are used to indicate like components.

The present disclosure describes a system-on-a-chip (SoC) used for debugging the hardware/software interaction. The system-on-a-chip (SoC) includes an analog delay locked loop module configured with a synthesizable delay logic module in parallel. Inputs of the analog delay locked loop module and synthesizable delay logic module are coupled with each other. Further, selection logic is provided to select any one of the module at a time.

Another embodiment of the present disclosure illustrates a system-on-a-chip comprising: an analog delay locked loop module; a synthesizable delay logic module having its input coupled to the input of said analog delay locked loop module; and a selection logic operatively coupled to the output of said analog delay locked loop module and synthesizable delay logic module configured to provide one of said outputs. Further, the synthesizable delay logic comprises a plurality of delay gates coupled in front-to-back series arrangement and the outputs of the delay gates are coupled to a multiplexer. The selection line of the multiplexer is programmed to select the outputs of the gates.

Another embodiment of the present disclosure illustrates, a DDR SDRAM memory comprising: an analog delay locked loop module; a synthesizable delay logic module having its input coupled to the input of said analog delay locked loop module; and a selection logic operatively coupled to the output of said analog delay locked loop module and synthesizable delay logic module configured to provide one of said outputs. Further, the synthesizable delay logic comprises a plurality of delay gates coupled in front-to-back series arrangement and the outputs of the delay gates are coupled to a multiplexer. The selection line of the multiplexer is programmed to select the outputs of the gates.

Another embodiment of the present disclosure illustrates a method for emulation in a system-on-a-chip comprising: providing an analog delay locked loop module; providing a synthesizable delay logic module; and selecting said analog delay locked module during normal operation and said synthesizable module during emulation.

FIG. 1 illustrates a system-on-a-chip which discloses an integration of analog delay logic and synthesizable delay logic according to an embodiment of the present disclosure. An analog delay logic module 101 is coupled in parallel to a synthesizable delay logic module 102. The data strobe signal DQS coming from memory is made as a common input to both analog delay logic module 101 and synthesizable delay logic module 102. Further, the outputs of the analog delay logic module 101 and synthesizable delay logic module 102 are multiplexed as an input to selection logic 103. The selection logic 103 is a type of 2-in-1 multiplexer. The select pin or mode pin of the multiplexer is programmed to function accordingly.

Figure 2:
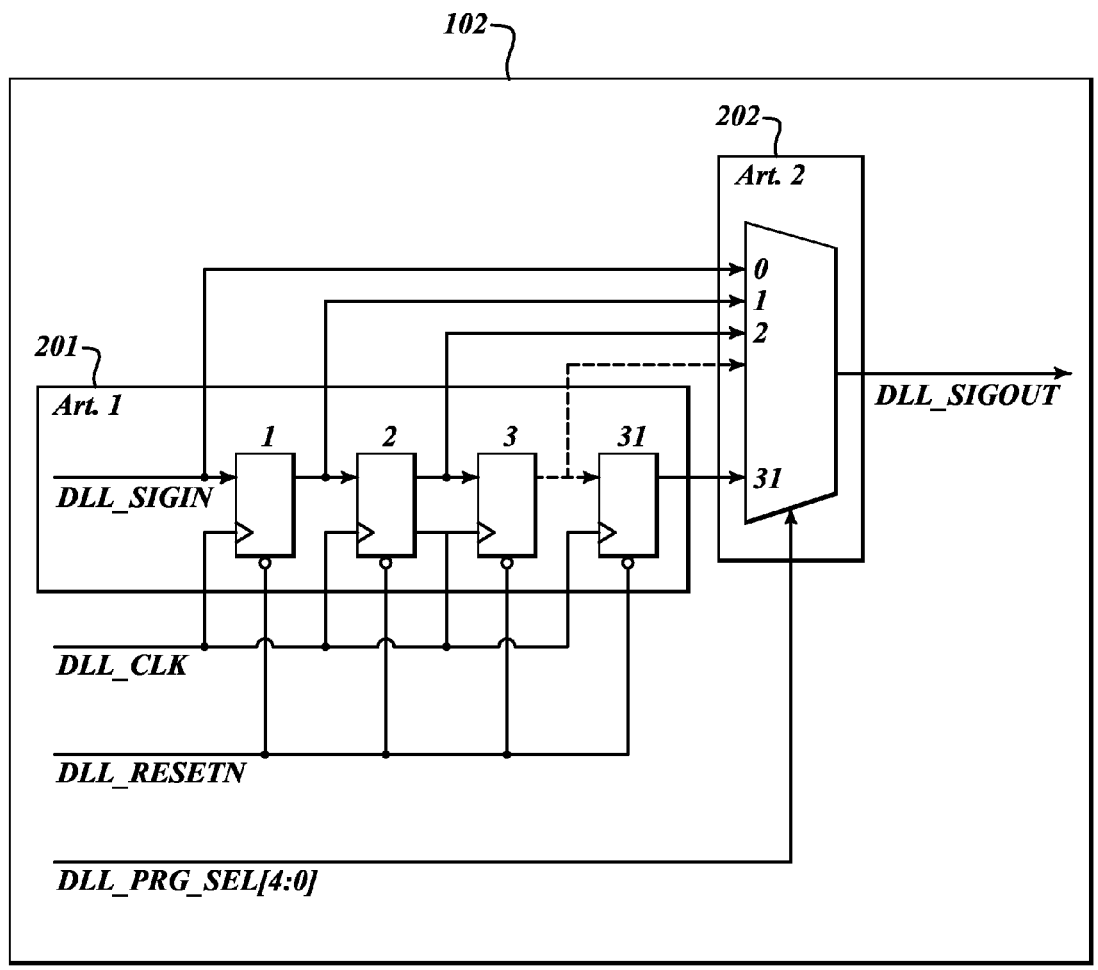
FIG. 2 illustrates internal architecture of synthesizable delay logic according to an embodiment of the present disclosure.

FIG. 2 illustrates internal architecture of synthesizable delay logic 102 according to an embodiment of the present disclosure. The synthesizable delay logic 102 is a chain of delay gates (or D Flip-Flops) 201, coupled in a cascade mode (or in front-to-back arrangement). The output of each the delay gates 201 are further multiplexed to a multiplexer 202. The selection line of the multiplexer 202 is programmed to select the output from the delay gates 201.

Further, the present disclosure provides a controllable delay to the strobe signal (e.g., from the memory), with respect to the clock, while performing emulation. In the present architecture, the synthesizable delay logic 102 is configured in parallel with analog delay logic 101 and is programmed respectively to provide delay solutions for emulation platforms. In addition to this, the real silicon may continue to use the analog DLL for other functions because of its inherent stability and accuracy. The present synthesizable delay logic accepts an input signal which passes through a chain of D flip flops (i.e., shift register) and is delayed by a specific number of clock cycles (m). The delay in number of clock cycles (m) is controlled by a DLL_PRG_SEL signal. DLL_PRG_SEL is a signal which specifies the amount of delay in terms of clock cycles on the input signal. For example, if we use an 'n' bit shift register along with a multiplexer, the maximum delay is 'n' clock cycles and minimum delay is zero. The signal is delayed at various tap points in the circuit and is available at the multiplexer input. The selection of the multiplexer is done by programming input bits depending on the value of DLL_PRG_SEL.

According to one embodiment in the present disclosure, the pin details of synthesizable delay logic are mentioned in the following Table 1. There are four input pins namely DLL_CLK, DLL_SIGIN, DLL_RESETN, DLL_PRG_SEL [4:0], and one output signal DLL_SIGOUT. The input pin DLL_CLK receives clock input. The input pin DLL_SIGIN receives the signal which is to be delayed. The input pin DLL_RESETN receives an active low signal to reset the design. The input pin DLL_PRG_SEL is a delay select line. The pin DLL_SIGOUT provides the final output as a delayed signal.

TABLE 1

| Pin | I/O | Description |
| --- | --- | --- |
| DLL_CLK | I | Clock to design |
| DLL_SIGIN | I | Signal to be delayed |
| DLL_RESETN | I | Reset to design, Active Low |
| DLL_PRG_SEL[4:0] | I | Delay select line |
| DLL_SIGOUT | O | Delayed Signal |

According to the present disclosure, the delay values for pin DLL_PRG_SEL of synthesizable delay logic are mentioned in the following Table 2.

TABLE 2

| DLL_PRG_SEL | DLL_SIGOUT delay |
| --- | --- |
| 00000 | No delay |
| 00001 | 1 clock cycle |
| 00010 | 2 clock cycle |
| - - - | - - - |
| 11111 | 31 clock cycles |

Figure 3:
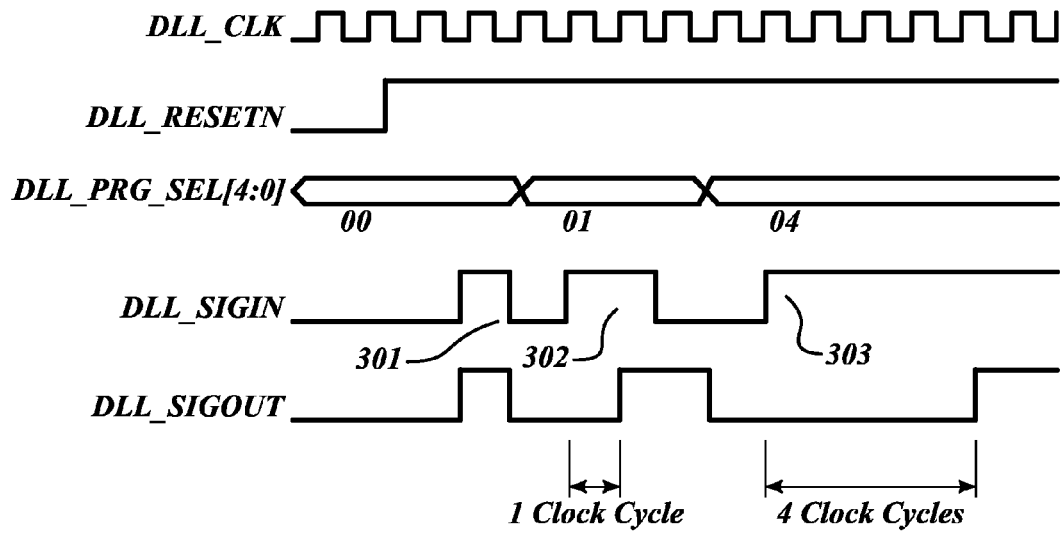
FIG. 3 illustrates the simulation results of the synthesizable delay logic according to the present disclosure.

FIG. 3 illustrates the simulation results of the synthesizable delay logic according to an embodiment of the present disclosure. The present design maintains output signal at zero till the reset signal (DLL_RESETN) is de-asserted. When the design clock is in running state and DLL_RESETN is in de-asserted state, then the DLL_PRG_SEL value is at "00" state. DLL_SIGOUT follows the DLL_SIGIN without any delay as shown in Region 301. When the DLL_PRG_SEL value is switched to "01" then the DLL_SIGOUT, being a function of DLL_SIGIN, is delayed by one clock cycle as shown in Region 302. When the DLL_PRG_SEL value is switched to "04" then the DLL_SIGOUT is a function of DLL_SIGIN is delayed by 4 clock cycles as shown in Region 303. Hence, when the DLL_PRG_SEL signal value is 'k' in hexadecimal, then the output signal DLL_SIGOUT, being a function of input signal DLL_SIGIN, is delayed by 'k' clock cycles.

Figure 4:
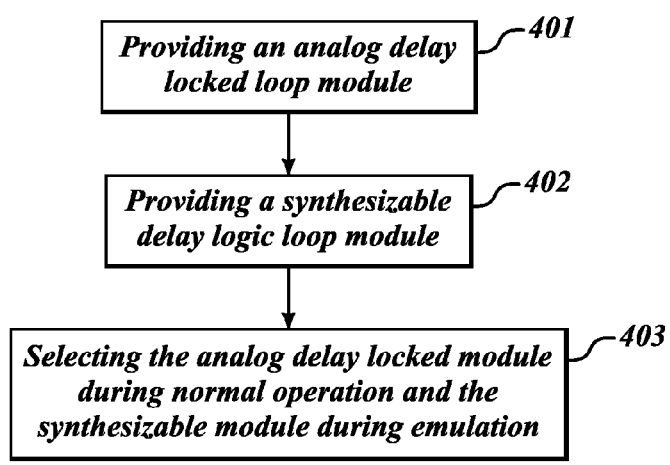
FIG. 4 illustrates a flow chart of a method for emulation in a system-on-a-chip according to the present disclosure.

Embodiments of the method for emulation in a system-on-a-chip are described in FIG. 4. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 4 illustrates a flow chart of a method for emulation in a system-on-a-chip according to an embodiment of the present disclosure. The step 401 provides an analog delay locked loop module. The step 402 provides a synthesizable delay logic module. And the step 403 states selection of said analog delay locked module during normal operation and said synthesizable module during emulation.

The present disclosure provides an emulator mapping process for the SoC. The implementation reduces manual intervention and makes the emulation mapping process very generic and technology independent and hence helps in reducing overall project cycle time. In some embodiments, the design is fully digital and fully synthesizable. In some embodiments, the total delay available is controllable by run time command (programming bits) and granularity (minimum delay) is controllable by clock frequency change, which is also under user control for emulation systems.

The present disclosure is applicable to various kinds of electronic architectures for improving the function and performance of conventional analog DLLs. Analog DLLs have been proposed for various types of memories and circuits. Such DLLs are used for various applications like clock recovery, synchronizing the data from memory with system clock, etc.

The present disclosure is applicable to many types of on-chip and off chip memories used in various in digital electronic circuitry, or in hardware, firmware, or in computer hardware, firmware, software, or in combination thereof. Embodiments of the present disclosure can be implemented in a computer program product tangibly embodied in a machine-readable storage device for execution by a programmable processor; and methods can be performed by a programmable processor executing a program of instructions to perform functions of the present disclosure by operating on input data and generating output. The present disclosure can be implemented advantageously on a programmable system including at least one input device, and at least one output device. Each computer program can be implemented in a high-level procedural or object-oriented programming language or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; CD-ROM and DVD-ROM disks; and buffer circuits such as latches and/or flip flops. Any of the foregoing can be supplemented by, or incorporated in ASICs (application-specific integrated circuits), FPGAs (field-programmable gate arrays) and/or DSPs.

It will be apparent to those having ordinary skill in this art that various modifications and variations may be made to the embodiments disclosed herein, consistent with the present disclosure, without departing from the spirit and scope of the present disclosure. Other embodiments consistent with the present disclosure will become apparent from consideration of the specification and the practice of the description disclosed herein.

Although the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The invention claimed is:

1. An apparatus, comprising:
    an analog delay locked loop module having an input and an output;
    a synthesizable delay logic module having an input and an output, the synthesizable delay logic module input coupled to the analog delay locked loop module input; and
    a selection logic having at least two inputs and an output, a first input of the selection logic operatively coupled to the analog delay locked loop module output and a second input of the selection logic coupled to the synthesizable delay logic module output, the selection logic configured to pass one of the at least two inputs to the selection logic output.

2. The apparatus according to claim 1 wherein the selection logic is a multiplexer.

3. The apparatus according to claim 1 wherein the synthesizable delay logic comprises:
    a plurality of delay gates coupled in series; and
    a multiplexer coupled to the output of each delay gate.

4. The apparatus according to claim 3 wherein the multiplexer has a selection line bus signal coupled to a programmed signal.

5. The apparatus according to claim 1 wherein the analog delay locked loop module and the synthesizable delay logic module are electrically configured in parallel.

6. The apparatus according to claim 1 wherein the analog delay locked loop module, the synthesizable delay logic module, and the selection logic are circuits in a system-on-a-chip.

7. The apparatus according to claim 1 wherein the analog delay locked loop module, the synthesizable delay logic module, and the selection logic are circuits in a memory control circuit.

8. A method of emulation in a system-on-a-chip, comprising:
    disabling operation of an analog delay locked loop module;
    enabling operation of a synthesizable delay logic module;
    delaying a signal that is input into the synthesizable delay logic module;
    providing a first selection signal to a first selection logic to direct the enabling and disabling; and
    providing a second selection signal to a second selection logic to direct the delaying.

9. The method according to claim 8 wherein providing the first selection signal includes coupling a signal to a multiplexer, the multiplexer configured to pass either a signal from the analog delay locked loop module or a signal from the synthesizable delay logic module.

10. The method according to claim 8 wherein the delaying comprises:
    passing the signal to an input of a first delay gate of a series of delay gates;
    passing the signal through the remaining delay gates of the series of delay gates, the input of each remaining delay gate of the series coupled to the output of a previous delay gate of the series; and
    selecting the output of one delay gate of the series as the output of the synthesizable delay logic module.

11. The method according to claim 10 wherein providing the second selection signal includes coupling an n-bit signal to a multiplexer, the multiplexer configured to implement the selecting of the output of one delay gate of the series as the output of the synthesizable delay logic module.

12. The method according to claim 11 wherein coupling the n-bit signal includes coupling a signal of at least 5 bits.

13. The method according to claim 8, further comprising:
    enabling operation of the analog delay locked loop module in a normal mode; and
    disabling operation of the synthesizable delay logic module after operation in an emulation mode.

14. The method according to claim 8, further comprising:
    providing a clock input to the synthesizable delay logic module; and
    delaying the signal that is input to the synthesizable delay logic module by a selectable number of clock cycles, the selectable number of clock cycles determined by the second selection signal.

15. The method according to claim 8 wherein the disabling, enabling, providing the first selection signal, and providing the second selection signal all occur without powering down the system-on-a chip.

16. The method according to claim 8 wherein delaying the signal includes delaying a data strobe signal.

17. A non-transitory computer readable device storing instructions that are executable by a processor to cause an electronic device to:
    disable operation of an analog delay locked loop module;
    enable operation of a synthesizable delay logic module;
    delay a signal that is input into the synthesizable delay logic module;
    provide a first selection signal to a first selection logic to direct the enabling and disabling; and
    provide a second selection signal to a second selection logic to direct the delaying.

18. The non-transitory computer readable device of claim 17 wherein the instructions executable by said processor further cause the electronic device to:
    pass the signal to an input of a first delay gate of a series of delay gates;
    pass the signal through the remaining delay gates of the series of delay gates, the input of each remaining delay gate of the series coupled to the output of a previous delay gate of the series; and
    select the output of one delay gate of the series as the output of the synthesizable delay logic module.

19. The non-transitory computer readable device of claim 17 wherein the instructions executable by said processor further cause the electronic device to:
    enable operation of the analog delay locked loop module in a normal mode; and
    disable operation of the synthesizable delay logic module after operation in an emulation mode.

20. The non-transitory computer readable device of claim 17 wherein the instructions executable by said processor further cause the electronic device to:
    provide a clock input to the synthesizable delay logic module; and delay the signal that is input to the synthesizable delay logic module by a selectable number of clock cycles, the selectable number of clock cycles determined by the second selection signal.

* * * * *